United States Patent
Hayashi et al.

[11] Patent Number: 6,151,241
[45] Date of Patent: Nov. 21, 2000

[54] FERROELECTRIC MEMORY WITH DISTURB PROTECTION

[75] Inventors: Shinichiro Hayashi; Tatsuo Otsuki, both of Osaka, Japan; Carlos A. Paz de Araujo, Colorado Springs, Colo.

[73] Assignees: Symetrix Corporation, Colorado Springs, Colo.; Matsushita Electronics Corporation, Japan

[21] Appl. No.: 09/314,800

[22] Filed: May 19, 1999

[51] Int. Cl.[7] ............................ G11C 11/22; G11C 11/00
[52] U.S. Cl. ............................ 365/145; 365/148
[58] Field of Search ..................... 365/145, 148

[56] References Cited

U.S. PATENT DOCUMENTS

| | | |
|---|---|---|
| 4,712,876 | 12/1987 | Umeda et al. . |
| 5,224,069 | 6/1993 | Natori . |
| 5,341,325 | 8/1994 | Nakano et al. ............... 365/145 |
| 5,512,773 | 4/1996 | Wolf et al. ................... 365/145 |
| 5,579,258 | 11/1996 | Adachi ......................... 365/145 |
| 5,699,035 | 12/1997 | Ito et al. . |

FOREIGN PATENT DOCUMENTS

| | | |
|---|---|---|
| 0 702 372 A2 | 3/1996 | European Pat. Off. . |
| 08180671 | 7/1996 | European Pat. Off. . |
| 0 847 059 A2 | 6/1998 | European Pat. Off. . |

*Primary Examiner*—Trong Phan
*Attorney, Agent, or Firm*—Duft, Graziano & Forest, P.C.

[57] ABSTRACT

A ferroelectric field effect transistor memory cell includes a thin film varistor located between the gate electrode and the ferroelectric layer. The varistor protects the ferroelectric layer from disturb voltage pulses arising from memory read, write and sense operations. A second electrode is located between the thin film varistor and the ferroelectric layer. The thin film ferroelectric is positioned over the channel of a transistor to operate as a ferroelectric gate. For voltages at which disturb voltages are likely to occur, the thin film varistor has a resistance obeying a formula $R_d > 10 \times 1/(2\pi f C_F)$, where $R_d$ is resistivity of the thin film varistor, f is an operating frequency of said memory, and $C_F$ is the capacitance of the ferroelectric layer. For voltages at or near the read and write voltage of the memory, the thin film varistor has a resistance obeying a formula $R_d < 0.1 \times 1/(2\pi f C_F)$.

20 Claims, 4 Drawing Sheets

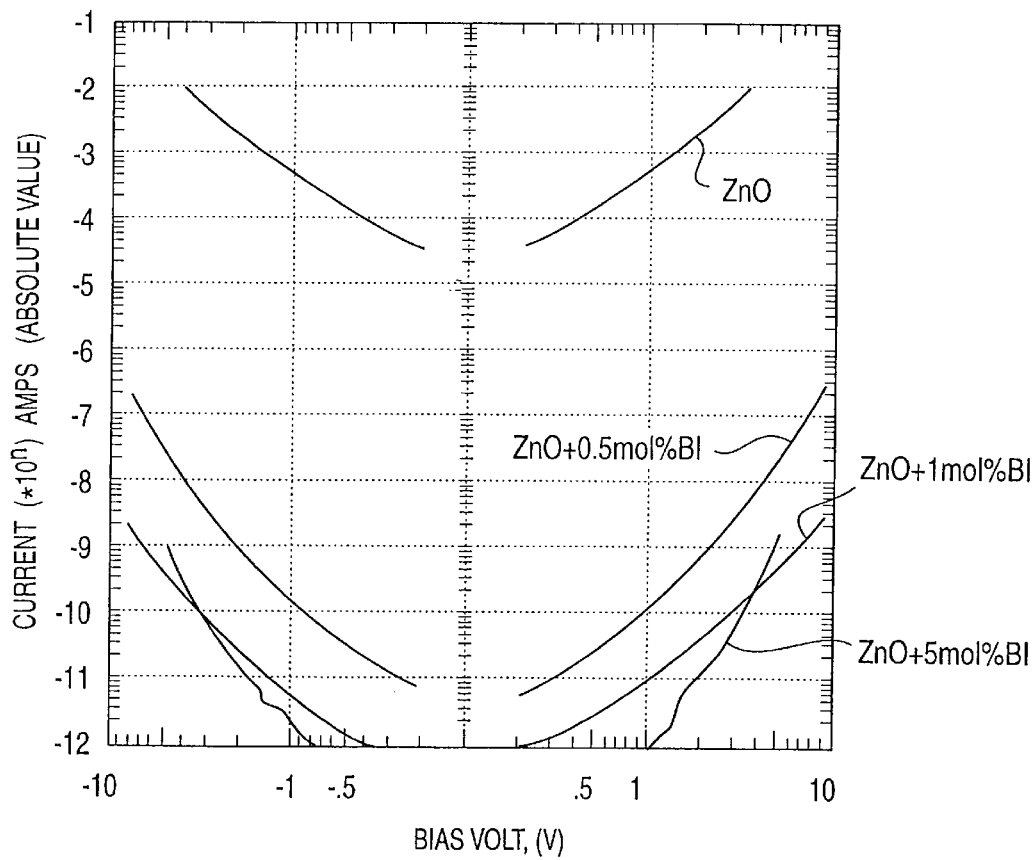
FIG. 4
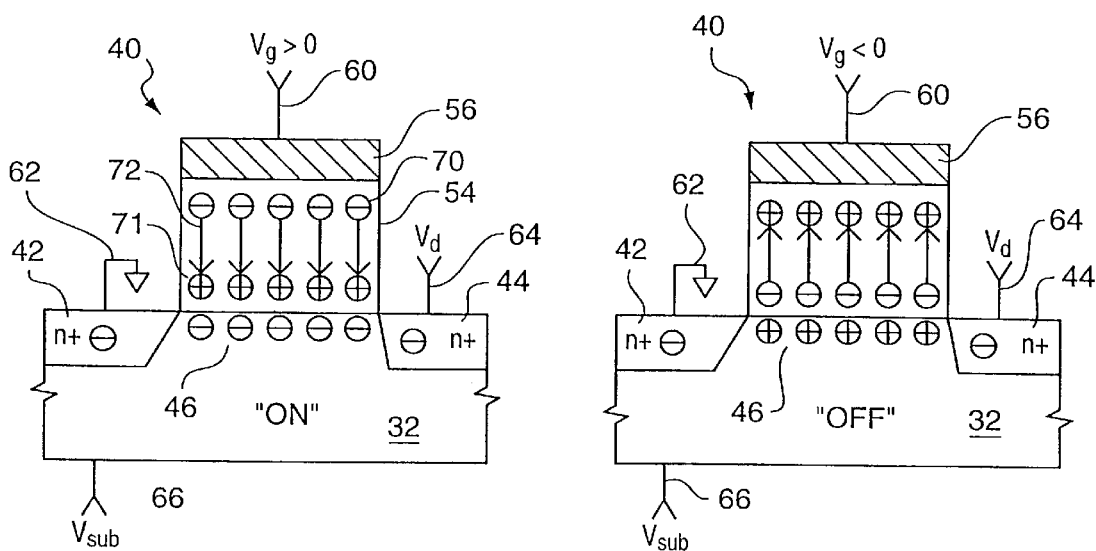
FIG. 5   FIG. 6

FERROELECTRIC MEMORY WITH DISTURB PROTECTION

BACKGROUND OF THE INVENTION

1. Field of the Invention

The present invention pertains to the field of integrated circuit memory cells and, particularly, ferroelectric devices that are used as components in nonvolatile memories. More specifically, the ferroelectric devices include ferroelectric capacitors and field effect transistors that are resistant to disturb voltage pulses.

2. Statement of the Problem

Ferroelectric materials are used in nonvolatile memories because they have the ability to retain information for long periods of time. Ferroelectrics polarize in the presence of an applied field and subsequently retain a polarized state for an indefinite period of time after the field is removed. The class of ferroelectrics including the layered superlattice materials described in WO 93/12542 in the name of Araujo et al., in thin film form, can retain sufficient polarization to perform memory operations for approximately ten years or more after the ferroelectrics have been polarized and the field has been removed.

The ability of ferroelectric memories to retain stored data is, in actuality, much shorter than the period of time the ferroelectric alone is capable of retaining polarization, due to the manner in which memories must operate. Current proposed ferroelectric memory architecture designs require the ferroelectrics to withstand small unintended voltage pulses as nearby capacitors are being read or written. These small voltage pulses are referred to in the art as "disturb" voltages. For example, experimental results show a lead zirconium titanate (PZT) capacitor can withstand approximately $10^8$ repetitions of a 0.4 volt (V) disturb voltage pulse with a 10% loss in retained polarization. Polarization degrades much more rapidly for larger pulses with $10^8$ cycles at 1 V causing an approximate two-thirds loss in retained polarization.

FIG. 1 shows a disturb voltage loss for a capacitor including a layered superlattice material, i.e., strontium bismuth tantalate. Polarization losses due to disturb voltages are similar to the losses in PZT, i.e., a normalized percentage for retained polarization projects to an approximate two-thirds loss after $10^8$ unidirectional cycles at 1 V. Present state-of-the-art memories utilize a write pulse of about 3 V. FIG. 1 indicates that even for a disturb voltage that is one-tenth of the state-of-the-art write voltages, that is even for disturb voltages of 0.3 V, the polarization is significantly degraded.

WO 93/12542 shows a ferroelectric random access memory (FERAM) cell consisting of a conventional field effect transistor and a ferroelectric capacitor. The bottom electrode of the capacitor is connected to a transistor active area in the manner of a conventional 1T 1C dynamic random access memory (DRAM) cell. In reference to FIGS. 3C and 3D of WO 93/12542, the transistor gate is connected to the word line, and the transistor source area is connected to the bit line. The transistor drain area is connected to the bottom electrode of a ferroelectric capacitor where data is stored. The bit line and word line are driven to high and low voltages for read and write operations, which subject the ferroelectric material to disturb voltages. Over time, these disturb voltages degrade the ferroelectric polarization until memory operations can no longer be performed, unless the memory storage state is read and rewritten in a refresh operation similar to that for conventional DRAMS.

Nakamura et al., "A Single-Transistor Ferroelectric Memory Cell", IEEE p. 68 (1995) shows a single transistor memory cell; i.e., a ferroelectric floating gate random access memory (FFRAM) having a gate that is formed as a metal-ferroelectric-metal-insulator-semiconductor (MFMIS) structure. The device uses a floating gate formed of conventional silicon. The silicon bottom gate is used as the bottom electrode, and a ferroelectric layer is grown on top of the gate. A first electrode resides atop the ferroelectric layer. The charge of the gate is controlled by using a first electrode to polarize the ferroelectric. The localized field of the polarized ferroelectric is used to alter the threshold voltage across the transistor source/drain regions. The memory cell may be enhanced by the addition of a back gate, which is used as a bit line and held at a programming voltage, i.e., a voltage sufficient to cause ferroelectric switching. The first electrode is used as the word line and held at one-half the programming voltage. Other FFRAM transistors have been made including an MFMIS gate formed of a vertical sequence including silicon dioxide, polysilicon, iridium oxide, lead zirconium titanate, iridium oxide, and iridium. The use of an MFMIS gate in FFRAM cells does not eliminate problems that derive from disturb voltages because many cells are disturbed by variations in the voltage on either the word line or the bit line, as these lines are applied to the specific architecture of the MFMIS gate. There remains a need to protect ferroelectrics in integrated circuit memories from the effects of disturb voltages.

The FFRAM discussed above is one type of a ferroelectric field effect transistor or FFET. Other FFETS are disclosed in U.S. Pat. No. 5,523,964 issued Jun. 4, 1996 to McMillan et al. These FFETS, as well as other FFRAMS also suffer from the disturb problem to varying degrees.

SOLUTION

The present invention overcomes the above problems by providing a thin film device to protect ferroelectric devices, such as memory cells in integrated circuit ferroelectric memories, from the effects of disturb voltages. In one embodiment, the disturb protect device is a variable resistor or varistor. The varistor eliminates or reduces the magnitude of disturb voltage pulses applied to the ferroelectric. At the low voltage levels of typical disturb voltage pulses, the varistor becomes charged in a manner that screens the applied field from the ferroelectric layer, thereby preventing partial polarization switching in the ferroelectric. At high voltages intended to switch the polarization state of the ferroelectric, the varistor becomes much less resistive, thereby permitting nearly the entire voltage to be applied to the ferroelectric layer.

A ferroelectric device according to the invention can be used in ferroelectric integrated circuit memory devices, generally referred to as FERAMS herein, such as a ferroelectric field effect transistor (FFET), including the FFRAM discussed above and FERAMS utilizing ferroelectric capacitors. In the preferred embodiment, the memory device is an FFET. The FFET includes a substrate, an n or p-doped source region formed within the substrate, and an n or p-doped drain region formed within the substrate, channel region between the source region and the drain region, and a ferroelectric gate. The ferroelectric gate is located directly above the channel region to modulate the flow of current between the source region and the drain region depending upon the polarization state of the ferroelectric gate. An electrode, or a combination of electrodes, is utilized to apply an electric field to the ferroelectric for switching the polarization state. A disturb protect device protects the ferroelectric material from the effects of disturb voltages. The disturb protect device generally includes a thin film layer or a combination of thin films that alters the flow of electric current as a function of voltage. More specifically, the protecting means preferably includes a thin film varistor or Schottky diode.

A thin film varistor is the most preferred structure for disturb protect device. A zinc oxide based varistor is preferred, and dopant elements are preferably added and include bismuth, yttrium, praseodymium, cobalt, antimony, manganese, silicon, chromium, titanium, potassium, dysprosium, cesium, cerium, iron, and combinations thereof. Zinc oxide doped with yttrium in combination with bismuth is particularly preferred.

Data is preferably input into to the FFET memory cell via a first electrode contacting the top of the thin film varistor, thus this electrode may be referred to as the "bit line" in analogy to a DRAM. Either the source region or the drain region of the transistor can be used to select the memory cell to be written to and/or read, and thus, in analogy to DRAM terminology, the electrical contact to this region may be referred to as a "word line". Preferably, there is a second electrode between the bottom of the varistor and the ferroelectric gate; the voltage applied to the first gate during read operations is sufficiently high that the varistor passes it to the second electrode, which applies the voltage to the ferroelectric layer to switch it.

The read and write operations applied to neighboring FFET memory cells cause disturb voltage pulses to be applied to the varistor. The varistor reduces or prevents voltage noise corresponding to the read and write operations of neighboring cells from reaching the ferroelectric material of the gate. Any field reaching the gate is so small in magnitude as to have a negligible effect; that is, the disturb voltage is negligible.

Preferably, at "high" voltages equal to or near the operational voltage of the memory, that is, the switching voltage that is applied to the ferroelectric memory cell in the read and write cycles, which voltage we designate as $V_H$, the resistivity of the thin film varistor, $R_d$, and the capacitance ferroelectric layer, $C_F$, are related as follows:

$$R_d > 0.1 \times 1/(2\pi f C_F) \quad (1)$$

where f is the operating frequency of the memory. The varistor has little effect on the read and write operations if formula (1) is adhered to when designing the FFET memory cell and selecting materials for its components. Most preferably, at voltages equal to or near the operational voltage of the memory, $V_H$, the resistivity of the thin film varistor, $R_d$, and the capacitance ferroelectric layer, $C_F$, are related as follows:

$$R_d > 0.01 \times 1/(2\pi f C_F) \quad (2)$$

where f is the operating frequency of the memory. The varistor has negligible effect on the read and write operations if formula (2) is adhered to when designing the FFET memory cell and selecting materials for its components.

Preferably, at "low" voltages of one-half the memory operational voltage or less, which voltage we shall designate as $V_L$, the resistivity of the thin film varistor, $R_d$, and the capacitance ferroelectric layer, $C_F$, are related as follows:

$$R_d > 10 \times 1/(2\pi f C_F) \quad (3)$$

where f is the operating frequency of the memory. The effects of disturb voltages are small if formula (1) is adhered to when designing the FFET memory cell and selecting materials for its components. Most preferably, at voltages of one-half the memory operational voltage or less, the resistivity of the thin film varistor, $R_d$, and the capacitance ferroelectric layer, $C_F$, are related as follows:

$$R_d > 100 \times 1/(2\pi f C_F) \quad (4)$$

where f is the operating frequency of the memory. The effects of disturb voltages are negligible if formula (2) is adhered to when designing the FFET memory cell and selecting materials for its components.

The disturb protect device and method according to the invention increases the reliability of the memory by a factor of at least a thousand, and can provide increases in reliability by a factor of a million or more, without significantly affecting the read and write operations of the memory. Numerous other features, objects and advantages of the invention will become apparent from the following description when read in conjunction with the accompanying drawings.

BRIEF DESCRIPTION OF THE DRAWINGS

FIG. 4 is a graph showing measurements of the absolute value of the leakage current versus voltage showing nonohmic behavior in thin film varistor layers of the type used in the present invention for disturb protection of the ferroelectric layer;

FIG. 5 illustrates the state of polarization of the ferroelectric material and the resulting channel state for an FFET for the "ON" state;

FIG. 6 illustrates the state of polarization of the ferroelectric material and the resulting channel state for an FFET for the "OFF" state;

DETAILED DESCRIPTION OF THE PREFERRED EMBODIMENT

Figure 2:
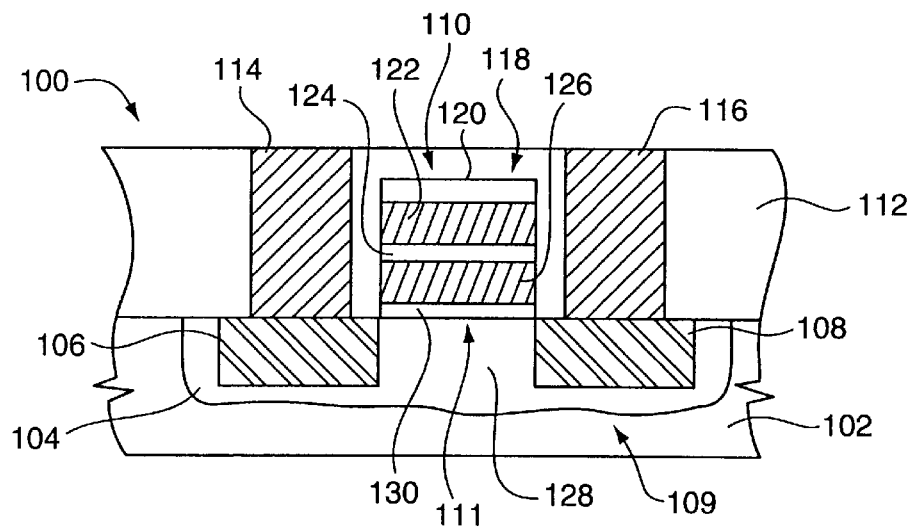
FIG. 2 depicts a ferroelectric field effect transistor (FFET) memory cell having a varistor layer to protect the storage state of the transistor in a manner that prevents the problematic effects of disturb voltage pulses shown in FIG. 1.

As is conventional in the art, in this disclosure, the term "substrate" is used in a general sense where it includes one or a number of layers of material, such as layer 124 in FIG. 2, on which another layer of solid material may be deposited, and also in a particular sense in which it refers to a wafer 102, generally formed of silicon, gallium arsenide, glass, ruby or other material known in the art, on which the other layers are formed. Unless otherwise indicated, in this specification it means any integrated circuit layer on which a thin film material is deposited.

Terms of orientation, such as "above", "top", "upper", "below", "bottom" and "lower" herein, mean relative to the wafer or substrate such as 102 in FIG. 2. That is, if a second element is "above" a first element, it means it is farther from the substrate 102; and if it is "below" another element, then it is closer to the substrates 102 than the other element. The long dimension of substrate 102 defines a plane that is considered to be a "horizontal" plane herein, and directions perpendicular to this plane are considered to be "vertical". If a first element is indicated to be "directly above" a second element, it means that a line perpendicular to the substrate passing through the first element also passes through the second element.

The term "thin film" herein means a thin film of a thickness appropriate to be used in an integrated circuit. Such thin films are less than 1 micron in thickness, and generally are in the range of 20 nanometers (nm) to 500 nm. It is important to distinguish this term from the same term, i.e. "thin film", as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

The terms FFET, FFRAM, FERAM and other similar terms are not uniformly applied in the art. In this disclosure, ferroelectric field effect transistor (FFET) will mean a memory device in which a ferroelectric element controls the flow of charge in a channel, which definition is intended to include FFRAMS discussed above as well as any other transistor-like ferroelectric memory device. The term ferroelectric RAM (FERAM) will be used to apply to any ferroelectric random access memory device, including both FFETS and ferroelectric devices which use a capacitor as the ferroelectric element.

A Varistor-Protected FFET Memory Cell

FIG. 2 depicts a ferroelectric memory device, namely, FFET cell 100 according to the present invention. FFET cell 100 includes a semiconducting wafer 102, interlayer dielectric (ILD) 112, conductors 114 and 116, and varistor-protected gate layered sequence 118. Wafer 102 is preferably a silicon wafer, but may also be any other conventional material including at least indium antimonide, magnesium oxide, strontium titanate, sapphire, quartz ruby, gallium arsenide, silicon-germanium, and combinations of these materials. Wafer 102 includes an n or p-doped tub 104 partially surrounding a pair of transistor active areas 106 and 108, which, as known in the art, are p or n-doped regions which can be either a source or a drain, depending on the voltages applied to them. Thus, we shall refer to them as source/drains herein, specifically, source/drain 106 and source/drain 108. The source/drain 106 and source/drain 108 are n-doped when tub 104 is p-doped and vice-versa. After the formation of varistor/gate layered sequence 118, which will be described in detail below, ILD 112 is formed, and then wells are formed in ILD 112 which are filled with conductors 114 and 116 to provide electrical contacts to the active areas 106 and 108, respectively.

Varistor-protected gate layer sequence 118 includes a first or top electrode 120, thin film varistor layer 122, a bottom or second electrode 124, ferroelectric gate 126, and optional buffer layer 130. Electrodes 120 and 124 are preferably made of platinum, but may also be made of other conductive materials, such as polysilicon, aluminum, iridium, or tungsten and generally are multi-layer conductors, often including an adhesion layer such as titanium, and/or a barrier layer, such as titanium nitride. Varistor layer 122 is preferably made of zinc oxide doped with yttrium and/or bismuth in an amount ranging from 1% to 10% of the molar concentration because thin films having these concentrations have the greatest nonohmic exponents over a wide range of voltage and current flow in thin film form. Second electrode 124 is positioned below varistor layer 122 to place varistor layer 122 between first electrode 120 and second electrode 124 and above ferroelectric layer 126. Ferroelectric layer 126 lies above channel region 128 extending between active areas 106 and 108.

An optional buffer layer 130 is positioned between ferroelectric layer 126 and wafer 102. The preferred materials for buffer layer 130 include silicon nitride, tantalum nitride, aluminum titanium nitride, and titanium nitride, with silicon nitride being most preferred, but also can include iridium oxide or other conductive metal oxides. Buffer layer 130 is used to compensate for surface irregularities on wafer 102. These irregularities may include thermally induced features, such as cracks or roughness, as well as point-charge defects in the substrate lattice. Surface charge defects in wafer 102 can be especially problematic in ferroelectric devices because these defects have a field-screening effect that reduces the magnitude of an applied field passing through wafer 102. The use of silicon nitride or titanium nitride is preferred because these nitrides also serve to prevent the interlayer diffusion of contaminants between adjacent thin films. Specifically, buffer layer 130 prevents upward diffusion of doped silicon moieties from wafer 102. This type of diffusion can produce a multitude of charge traps that will, in the absence of buffer layer 130, significantly impair the electrical stability of the gate region. FFET devices including buffer layer 130 have box-like polarization curves that are optimal for use in ferroelectric memories, while FFET devices without buffer layer 130 can have irregularities, such as goose-neck regions of incomplete polarization, that impair memory performance.

Varistor 122 with or without electrode 120 may also be used with other ferroelectric memory designs utilizing other ferroelectric devices, such as a ferroelectric memory utilizing a ferroelectric capacitor, such as those described in U.S. Pat. No. 5,719,416 issued Feb. 17, 1998 to Yoshimori et al., and U.S. Pat. No. 5,561,307 issued Oct. 1, 1996 to Mihara et al., both of which are hereby incorporated by reference as though fully disclosed herein. In this configuration, it is possible to eliminate second electrode 124.

Ferroelectric layer 126 may be made of any material that is ferroelectric in thin film form. For purposes of this application, a thin film is any material having a thickness of less than 1000 nm. Ferroelectric perovskites including lead titanate and lead zirconium titanate (PZT) may be used, but it may be difficult to obtain sufficient polarization from these materials at thicknesses less than about 150 nm. Thus, it is preferred to use ferroelectric layered superlattice materials of the type disclosed in U.S. Pat. No. 5,803,961 issued Sep. 8, 1998 to Azuma et al., which is hereby incorporated by reference to the same extent as though fully disclosed herein.

Especially preferred layered superlattice materials are those including strontium bismuth tantalate or strontium bismuth niobium tantalate. The layered superlattice materials may be scaled to a thickness of less than about 40 nm while still providing sufficient polarization to perform memory operations.

All types of layered superlattice materials may be generally summarized under the average empirical formula:

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-2}. \quad (5)$$

Note that Formula (5) refers to a stoichiometrically balanced list of superlattice-forming moieties. In Formula (5), A1, A2 . . . Aj represent A-site elements in a perovskite-like octahedral structure, which includes elements such as strontium, calcium, barium, bismuth, lead, and mixtures thereof, as well as other metals of similar ionic radius. S1, S2 . . . Sk represent superlattice generator elements, which preferably include only bismuth, but can also include trivalent materials such as yttrium, scandium, lanthanum, antimony, chromium, and thallium. B1, B2 . . . Bl represent B-site elements in the perovskite-like structure, which may be elements such as titanium, tantalum, hafnium, tungsten, niobium, vanadium, zirconium, and other elements; and Q represents an anion, which preferably is oxygen but may also be other elements, such as fluorine, chlorine and hybrids of these elements, such as the oxyfluorides, the oxychlorides, etc. The superscripts in Formula (5) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (5) includes the cases where the unit cell may vary throughout the material; e.g., in $Sr_{0.75}Ba_{0.25}Bi_2Ta_2O_9$, on the average, 75% of the time Sr is the A-site atom and 25% of the time Ba is the A-site atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (5) is written in the more general form because the invention is intended to include the cases where either of the A and B sites and the superlattice generator can have multiple elements. The value of z is found from the equation:

$$(a1w1+a2W2\ldots +ajwj)+(s1x1+s2x2\ldots +skxk)+(b1y1+b2y2\ldots +blyl)=2z. \quad (6)$$

The layered superlattice materials do not include every material that can be fit into Formula (5), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra.

The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator, but bismuth, if present in amounts less than a threshold stoichiometric proportion, will spontaneously concentrate as a non-perovskite-like bismuth oxide layer.

It should also be understood that the term layered superlattice material herein also includes doped layered superlattice materials. That is, any of the material included in Formula (5) may be doped with a variety of materials, such as silicon, germanium, uranium, zirconium, tin, chromium, dysprosium, or hafnium.

Layered superlattice materials at least include all three of the Smolenskii-type ferroelectric layered superlattice materials, namely, those having the respective average empirical formulae:

$$A_{m-1}S_2B_mO_{3m+3}; \quad (7)$$

$$A_{m+1}B_mO_{3m+1}; \text{ and} \quad (8)$$

$$A_mB_mO_{3m+2}; \quad (9)$$

wherein A is an A-site metal in the perovskite-like superlattice; B is a B-site metal in the perovskite-like superlattice; S is a trivalent superlattice-generator metal such as bismuth or thallium; and m is a number sufficient to balance the overall formula charge. Where m is a fractional number in the overall formula, the formula typically provides for a plurality of different or mixed perovskite-like layers each having a different integer value. These mixed layered superlattice materials actually comprise a plurality or mixture of perovskite-like layers having integer m values according to Formula (10) below. The separate layers spontaneously generate from solution and do not require separate deposition steps. The A-site metals and B-site metals may include mixtures of cations having similar ionic radii.

In layered superlattice materials according to Formula (5), thermodynamics favor the formation of oxygen octahedra structures in layers having a thickness of m octahedra according to the formula $$(A_{m-1}B_mO_{3m+1})^{2-}, \quad (10)$$

wherein m is an integer greater than one and the other variables are defined above. These layers are separated by bismuth oxide layers having the formula $$(Bi_2O_2)^{2+}, \quad (11)$$

wherein Bi is S of Formula (5).

The superlattice-generator layers, S, include oxides of bismuth (III), and may also include other similarly sized trivalent metal cations such as thallium (III). Bismuth also functions as an A-site metal in the perovskite-like lattice if it is present in excess of the stoichiometrically required amount for generating the layered superlattice material according to Formula (5). The most preferred layered superlattice materials include strontium bismuth tantalate, strontium bismuth niobate, and strontium bismuth niobium tantalate. Additionally, it can be advantageous to provide these materials with a mixture of B-site elements including vanadium and tungsten.

With the exception of varistor layer 122, the components of FFET cell 100 are made by conventional means known to those skilled in the art. For example, the ferroelectric layer 126 is preferably deposited by a liquid deposition technique including spin-on or misting of the liquid precursor, and has a thickness ranging from 40 nm to 400 nm. This spin-on technique most preferably uses a liquid precursor solution including metal 2-ethylhexanoates wherein the metals have a stoichiometric representation corresponding to the metals content of the desired metal oxide. The precursor solution is applied to a substrate spinning in the range of 500 rpm to 3000 rpm, dried at a temperature in the range from 150° C. to 500° C., and annealed at a temperature ranging from 400° C. to 1000° C. The first and second electrodes 120 and 124 are preferably made of platinum or another noble metal that is sputter-deposited to a thickness of about 200 nm. The semiconducting wafer 102 can be purchased on commercial order from any number of companies, or it can be made on site by conventional means known to those skilled in the art.

Device Operation

In operation, ferroelectric layer 126 has a residual polarization state together with an associated field that modulates the flow of current in channel 128. The device shows a logic "1" or "ON" state when the residual polarization state of ferroelectric layer 126 permits electricity to pass from source 106 to drain 108. Descriptions of the electrical connections of source 106, drain 108 and electrode 120 in a ferroelectric memory are given in U.S. Pat. No. 5,523,964 issued Jun. 4, 1996 to McMillan et al., and U.S. patent application Ser. No. 09/170,590 filed Oct. 13, 1998, both of which are incorporated by reference to the same extent as though fully disclosed herein. The device shows a logic "0" or "OFF" state when the residual polarization state of ferroelectric layer 126 inhibits the passage of electricity from source 106 to drain 108. Ferroelectric layer 126 may be made of any thin film ferroelectric material, i.e., a ferroelectric material having a thickness typically ranging from 40 nm in extremely thin materials to about 400 nm or more in thicker ferroelectrics.

FIGS. 5 and 6 illustrate the operation of an FFET 40. In these figures, all the details of FFET 100 in FIG. 2 are not shown in order to simplify the drawing and make it easier to understand. Rather, FFET 40 includes only substrate 32, source/drains 42 and 44, channel 46, ferroelectric layer 54, and gate electrode 56. The figures also show a means 60 for applying a voltage to gate 56, a means 62 for applying a voltage to source/drain 42, a means 64 for applying a voltage to source/drain 44, and a means 66 for applying a voltage to substrate 32. Any such means known in the art may be used. In these figures, the doping of the active areas 42 and 44 is arbitrarily selected to be n-type and the substrate voltage is selected to be zero. FIG. 5 illustrates the state of polarization of ferroelectric material 54 and the resulting state of channel 46 for the FFET 40 for the "ON" state, while FIG. 6 illustrates the state of polarization of ferroelectric material 54 and the resulting state of channel 46 for the FFET 40 for the "OFF" state. In these figures, the circles with minus signs, such as 70, represent electrons; the circles with plus signs, such as 71, represent positive ions or vacancies; and the arrows, such as 72, represent the direction of polarization charge. If an electric field is applied to the FFET 40 in the upward direction in the figures, that is, if a positive voltage is applied to gate 56, then ferroelectric material 54 will develop a polarization as shown in FIG. 5. Preferably, this gate voltage is in the range from about 1 to 15 volts (V), and most preferably in the range of about 3 to 5 V. If the voltage is equal to or greater than the ferroelectric coercive voltage, essentially all the ferroelectric domains in ferroelectric material 54 will become polarized as shown; but even a small voltage, e.g., 1.0 V or higher, will cause some domains to switch. The positive polarization charge above channel 46 will induce electrons into the channel of a transistor, such as 109, which, since electrons are the carriers in the n-type material, will greatly increase the conductivity of the channel. Assuming a drain bias, $V_d$, preferably in the range of about 0.5 to 8 V, the increased conductivity of channel 46 will result in a greatly increased drain to source current, which is sensed to detect the "ON" state, which we will arbitrarily call a logic "1" state herein. If an electric field is applied to the FFET 40 in the downward direction in the figures, that is, if a negative voltage is applied to gate 56, then ferroelectric material 54 will develop a polarization as shown in FIG. 6. The negative polarization charge above channel 46 will induce a positive charge into the channel, which depletes the carriers in the n-type material, and will greatly decrease the conductivity of the channel. Assuming a drain bias, $V_d$, the decreased conductivity of channel 46 will result in a greatly decreased drain to source current, which is sensed to detect the "OFF" state, which we will arbitrarily call a logic "0" state herein. If p-type carriers are selected, then the opposite gate voltages and polarization states are required to produce the "ON" and "OFF" states, respectively.

Details Concerning The Varistor Layer

Thin film varistor layers exhibit non-linear current/voltage characteristics between the applied voltage and the current that flows through the varistor material. Specifically, the non-linear current/voltage characteristics can be evaluated by the magnitude of the nonohmic exponent N in the formula $$I=(V/C)^N, \qquad (12)$$

wherein V is the applied voltage, I is the current flowing through the element, and C is a constant. The nonohmic exponent N typically decreases in magnitude for thin films. This nonohmic behavior functions in the manner of a diode to prevent small disturb voltage pulses from disturbing the polarization state of the ferroelectric material in ferroelectric layer 126.

Figure 7A:
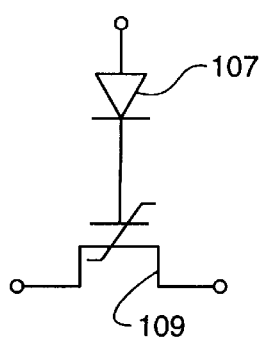
FIG. 7A shows an electrical circuit diagram representing one embodiment of an FFET 100 according to the invention.
Figure 7B:
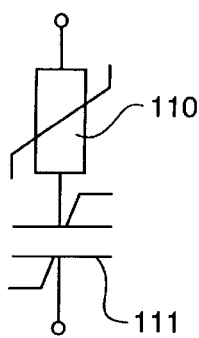
FIG. 7B shows an electrical circuit diagram representing the FFET 100 according to the invention.
Figure 8:
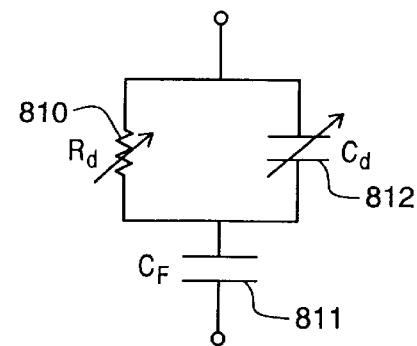
FIG. 8 shows an equivalent electrical circuit to the circuit of FIG. 7.

The desirable properties of a varistor 122 utilized to prevent disturb in an FFET 100 can be developed utilizing FIGS. 7–12. The gate layer sequence 118 in FIG. 2 can be viewed as a varistor device 110 including varistor 122 and electrodes 120 and 124, and a ferroelectric capacitor 111 formed by ferroelectric gate layer 126, electrode 124, and channel 128. An equivalent circuit for this structure is shown in FIG. 7B. To analyze the varistor in detail, we can represent it as a variable resistor 810, having a resistance $R_d$, and a variable capacitor 812, having the capacitance $C_d$, connected in parallel, as shown in FIG. 8. Since the resistance of the ferroelectric capacitor is much higher than that of the varistor, we can consider only its capacitive aspect as shown by capacitor 811 having capacitance $C_F$.

Figure 9:
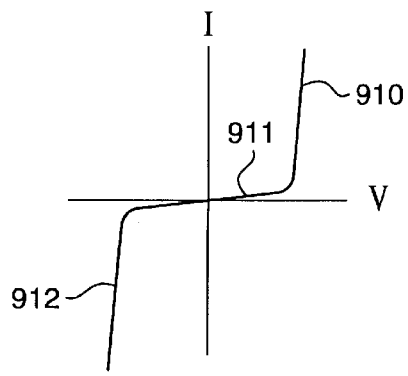
FIG. 9 is a graph of voltage versus current for an idealized disturb protect device according to the invention.
Figure 10:
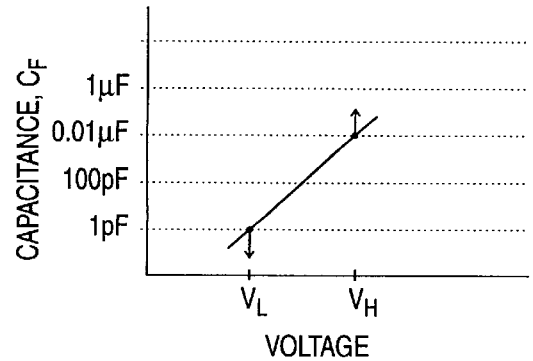
FIG. 10 illustrates the "high" voltage domain and the "low" voltage domain for the capacitance, $C_F$, of the most preferred ferroelectric capacitor.
Figure 11:
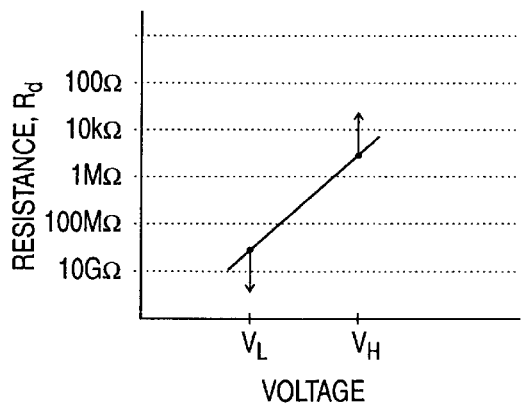
FIG. 11 illustrates the "high" voltage domain and the "low" voltage domain for the resistivity, $R_d$, of the most preferred varistor.
Figure 12:
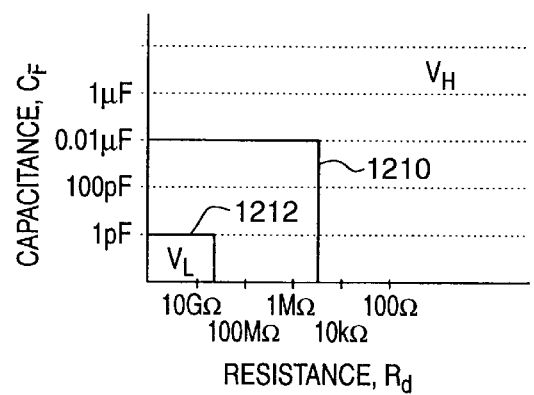
FIG. 12 combines the information in FIGS. 10 and 11 to illustrate the "high" voltage domain and the "low" voltage domain for the resistivity, $R_d$, of the most preferred varistor in relation to the capacitance, $C_F$, of the most preferred ferroelectric capacitor.

FIG. 9 shows a qualitative graph of voltage versus current for an ideal varistor that is to be utilized to protect a ferroelectric material from disturb. Ideally, the varistor has regions 910 and 911 where a small increase in voltage or electric field results in a large increase in current flow in the direction of the applied electric field and a region 911 where significant increases in voltage result in almost no increase in current flow. Ideally, it is desirable that the at "high" voltages close to the read and write voltages applied to electrode 120 be quickly transferred to electrode 124, with little voltage drop. Thus, it is desirable that the material be in the region 910 or 912 at and near the read and write voltages. In terms of the capacitance $C_F$ of the ferroelectric capacitor 111, the capacitance $C_d$ of the varistor capacitor 110, and the resistance $R_d$ of the varistor 122, it is desirable that $$C_d > 100 \times C_F, \qquad (13)$$

or $$R_d<0.01\times[1/(2\pi fC_F)], \quad (14)$$

where f is the operating frequency of the memory. Since for capacitances in a series the voltage drop across each of the capacitors is proportional to the inverse of the capacitance, Formula (14) assures that 99% of the read and write voltages applied to electrode 120 will reach electrode 124. Likewise, since the voltage drop across resistances is proportional to the resistance, Formula (14) also insures that 99% of any voltage applied to electrode 120 will reach electrode 124.

On the other hand, it is also desirable that at voltages significantly lower than the read and write voltages, that is, in the voltage region where disturb voltages are likely to occur, that a voltage applied to the electrode 120 not be transferred to the electrode 124, and if a voltage is transferred, it is much smaller than the disturb voltage applied to electrode 120; that is, there is a significant voltage drop across varistor 122. Thus, it is desirable that the material be in the region 911 at voltages significantly less than the read and write voltages. In terms of the capacitance $C_F$ of the ferroelectric capacitor 111, the capacitance $C_d$ of the varistor "capacitor" 110, and the resistance $R_d$ of the varistor 122, it is desirable that $$C_d<0.01C_F, \quad (15)$$

or $$R_d>100\times[1/(2\pi fC_F)], \quad (16)$$

where f is the operating frequency of the memory. Since for capacitances in a series the voltage drop across each of the capacitors is proportional to the inverse of the capacitance, Formula (16) assures that only one one-hundredth of any disturb voltage applied to electrode 120 will reach electrode 124. Likewise, since the voltage drop across resistances is proportional to the resistance, Formula (16) also insures that only one one-hundredth of any disturb voltage applied to electrode 120 will reach electrode 124.

Utilizing the definition of impedance:

$$Z=R/[1+(2\pi f)^2C^2R]^{1/2}, \quad (17)$$

where C is the capacitance and f is again the operating frequency, we get from formulae (13) and (14) that for "high" voltages at or near the read and write voltage, $V_H$, ideally, for a frequency of 10 kiloHertz (kHz), $$C_{dH}>0.01 \text{ microfarads } (\mu F) \quad (18)$$

or $$R_{dH}<100 \text{ kiloohms (k}\Omega\text{)}, \quad (19)$$

where $C_{dH}$ is the capacitance of the varistor 122 at the high voltage and $R_{dH}$ is the resistance of the varistor 122 at the high voltage. Similarly, for "low" voltages, i.e. voltages less than or equal to one-half the read and write voltage, $V_L$, ideally, for a frequency of 10 kHz, $$C_{dL}<1 \text{ picofarad (pf)} \quad (20)$$

and $$R_{dL}>1,600 \text{ megaohms (M}\Omega\text{)}. \quad (21)$$

If the conditions of formulae (15) through (17) hold for a varistor material, then it can be assured that the memory cell 100 can be easily written to voltages near or equal to $V_H$ and at the same time disturbs will not occur for voltages of $V_L$ or lower.

The above conditions hold strictly true only at 10 kHz, which is the lower limit for operating frequencies of common memories. If we do the same calculations for a frequency of about 1 megaHertz, which is the high end of operating frequencies for memories, we get about the same capacitance requirements but find that $R_d$ can be about 100 times smaller. Thus, if we select the conditions of formulae (15) through (17), the varistor should operate well at all common memory frequencies. The capacitance condition is shown in terms of a graph of voltage versus capacitance in FIG. 10. The arrow pointing up indicates that we want the capacitance to be in the region the arrow points to at the voltages near or equal to $V_H$, and the arrow pointing down indicates that we want the capacitance to be in the region the arrow points to at $V_L$ or lower. The resistance condition is shown in terms of a graph of voltage versus resistance in FIG. 11. The arrow pointing up indicates we want the resistance to be in the region the arrow points to at the voltages near or equal to $V_H$, and the arrow pointing down indicates that we want the resistance to be in the region the arrow points to for the voltages of $V_L$ or lower. The two curves are combined in FIG. 12, in which the acceptable resistance regions are plotted against the acceptable capacitance regions. The resistances and capacitances in the area $V_H$ outside the line 1210 are desirable for a varistor at or near the read and write voltage, and the resistances and capacitances in the area inside the line 1212 are desirable for a varistor at a voltage of $V_L$ or lower. In short, one can see from FIG. 12 that the resistance of materials that are especially suitable for use as a protective device for an FFET 100 should have a resistance that changes by four orders of magnitude between the voltages that are typical of disturb voltages and voltages near or at the read and write voltage.

Figure 1:
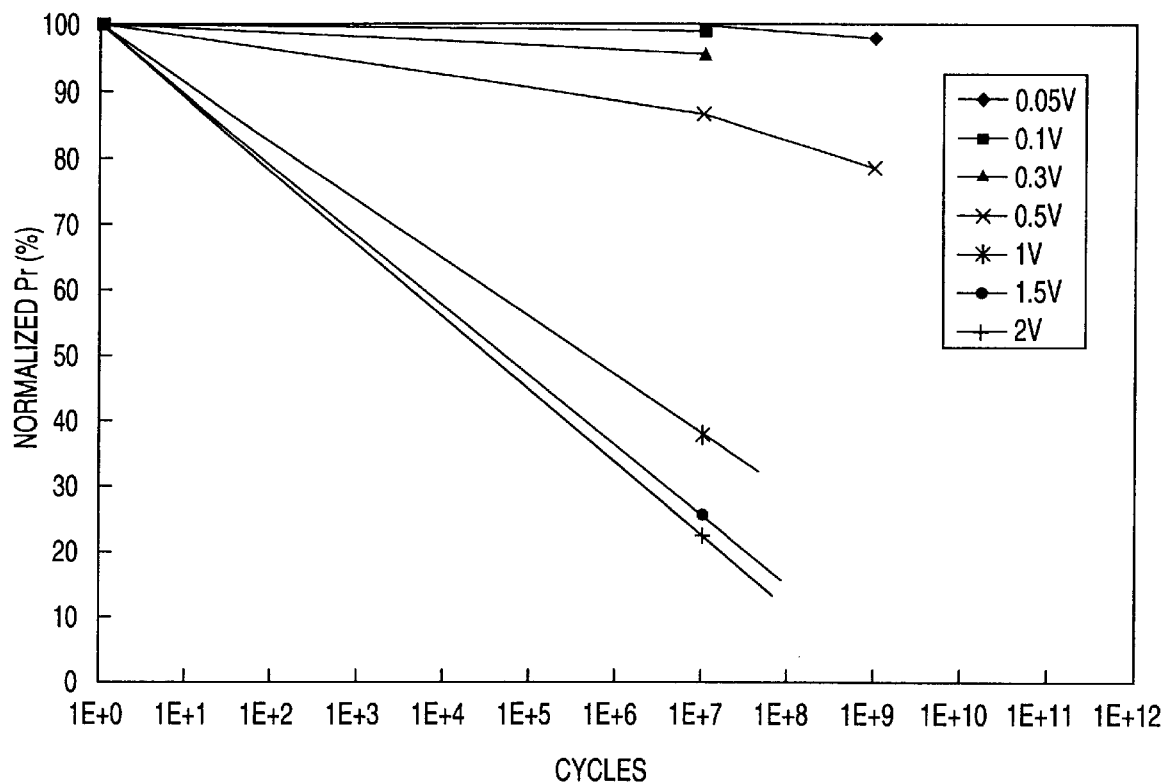
FIG. 1 depicts the effects of multiple unidirectional disturb voltage pulses upon a thin film ferroelectric as would occur in a conventional ferroelectric memory architecture.

The above discussion of the relationships between the resistance, $R_d$, of the protective device 110 and the capacitance, $C_F$, of the ferroelectric capacitor 111 has been aimed at determining the parameters for a protective device that would be ideal; that is, one which would have negligible effect on the read and write voltages and for which the disturb voltages that remain would be negligible. Since the effect of disturb voltage on the polarizability, as shown in FIG. 1, is non-linear, reducing the disturb voltage by a factor of one hundred will reduce the effect on the polarizability by a factor of about one thousand. The relationship between a polarizability decrease and the reliability of a device is also non-linear. That is, an increase in uncertainty in the polarizability of 10% can lead to a thousand-fold increase in invalid memory states, and a corresponding thousand-fold decrease in reliability of the device. Thus, a disturb protect device that falls within the above-discussed constraints can result in a million-fold increase in the reliability of a ferroelectric device.

It is evident from the above discussion that a disturb protect device 110 for which the parameters discussed are less than the ideal parameters can still have a significant ability to protect the ferroelectric device 111 from disturb voltages. For example, a disturb protect device for which:

$$C_d>10\times C_F, \quad (22)$$

or $$R_d<0.1\times[1/(2\pi fC_F)], \quad (23)$$

for the voltages at or near $V_H$, and for which $$C_d<0.1C_F, \quad (24)$$

or $$R_d > 10 \times [1/(2\pi f C_F)], \quad (25)$$

for voltages at or below $V_L$, will result in approximately 90% of the read and write voltages applied to electrode 120 reaching electrode 124, and will also result in only about 10% of any disturb voltage applied to electrode 120 reaching electrode 124. This can result in an improvement of roughly about ten-thousand-fold in reliability, and conservatively, at least a thousand-fold improvement in reliability. To obtain this level of improvement, only a difference in two orders of magnitude between the resistivity at the high voltage and the resistivity at the low voltage is required.

As we did for the ideal varistor for which Formulae (13) through (16) are true, we can also calculate preferred values of $C_{dH}$, $R_{dH}$, $C_{dL}$, and $R_{dL}$ for the varistor for which Formulae (22) through (25) are true. For the high voltage at or near the read and write voltage and at a frequency of 10 KHz, these are:

$$C_{dH} > 0.1 \,\mu F \quad (26)$$

or $$R_{dH} < 1 \, M\Omega, \quad (27)$$

where $C_{dH}$ is the capacitance of the varistor 122 at or near the read and write voltage, and $R_{dH}$ is the resistance of the varistor 122 at or near the read and write voltage. Similarly, for the low voltage of $V_L$ or less, for a frequency of 10 kHz, $$C_{dL} < 0.1 \, pf \quad (28)$$

and $$R_{dL} > 160 \, M\Omega. \quad (29)$$

As we saw above, these preferred capacitances do not change significantly at higher frequencies, while for frequencies of 1 MHZ, the preferred resistivity can be about two orders of magnitude lower.

Non-ohmic zinc oxide thin films are especially preferred for use as the varistor material. The addition of bismuth and yttrium dopants are capable of significantly improving the nonohmic behavior of these films, which have stable voltage performance characteristics, even in layers having a thickness ranging from about 50 nm to about 500 nm. These zinc oxide-based films include small crystal grains having an average particle diameter ranging from about 10 nm to about 300 nm.

The non-linear current/voltage characteristics of zinc oxide varistor materials occur due to a double Schottky barrier that exists at the interface between the zinc oxide crystal grains and the grain boundary dopant oxides. This type of barrier has a dopant oxide bounded by a first zinc oxide crystal grain and a second zinc oxide crystal grain. A conductive zone exists at the intercrystalline boundary, where the dopant oxide resides. This type of barrier necessitates that the crystalline interfaces between the zinc oxide crystal grains and the dopant metal oxide crystals must be present in a stable number, i.e., in a uniform distribution in the direction of film thickness. When the crystal grain size or diameter grows too large in relation to the cell surface area and the film thickness of the zinc oxide thin film varistor, then a uniform distribution of crystalline interfaces becomes difficult or impossible to obtain. The absence of an equal grain distribution causes unstable or nonlinear voltage performance characteristics.

The special property of nonohmic behavior is enhanced by a manufacturing process that utilizes liquid precursor solutions to yield the solid thin film varistor layer. Thus, there is a uniform distribution of dopant throughout the thin film layer. The precursor solutions include metal alkoxides, metal carboxylates, and metal alkoxycarboxylate complexes. The most preferred precursors include metal alkoxycarboxylates of the form $$(R'\text{—}COO\text{—})_a M(\text{—}O\text{—}R)_n, \quad (30)$$

or $$(R'\text{—}COO\text{—})_a M(\text{—}O\text{—}M'(\text{—}O\text{—}C\text{—}R'')_{b-1})_n, \quad (31)$$

wherein M is a metal having an outer valence of (a+n) and M' is a metal having an outer valence of b, with M and M' preferably being selected from the group of bismuth in combination with a dopant providing nonohmic behavior, particularly bismuth, yttrium, and combinations thereof; R and R' are respective alkyl groups preferably having from 4 to 9 carbon atoms and R" is an alkyl group preferably having from 3 to 8 carbon atoms. The latter formula, which has a central —O—M—O—M'—O— structure, is particularly preferred due to the formation in solution of at least 50% of the metal to oxygen bonds that will exist in the final solid metal oxide product. Similar —M—O—M'—O— structures are obtainable from reactions between metal alkoxycarboxylates and respective metal alkoxide or metal carboxylate reagents. These endothermic reactions are preferably driven to completion by distilling away reaction byproducts (alcohols and ethers) as well as any other contaminants having boiling points of less than 115° C., with 120° C. being more preferred, and 125° C. being most preferred. Elimination of these volatile moieties from solution advantageously reduces cracking and other defects in the final metal oxide films.

The liquid precursor that is used to form the thin film is preferably a metal alkoxide, metal carboxylate, or metal alkoxycarboxylate diluted with a xylene or octane solvent to a desired concentration. Polar solvents, especially n-butyl acetate, may be added as needed to solubilize the metal alkoxycarboxylates in solution. The use of an essentially anhydrous metal alkoxycarboxylate is particularly preferred due to the corresponding avoidance of water-induced polymerization or gelling, which can significantly reduce the shelf-life of solutions that contain alkoxide ligands. The presence of any hydrolysis-inducing moiety in solution is preferably avoided or minimized. Hydrolyzed precursors, such as conventional sol-gels, may also be utilized, but the increased sol-gel viscosity tends to impair the uniformity of thickness derived from the preferred spin-on application process; and the quality of the hydrolyzed solution tends to degrade rapidly with time. Therefore, made-ready hydrolyzed gels disadvantageously yield poor and inconsistent quality metal oxide films over a period of time.

The precursors are formed by heating an alcohol with a metal to form a metal alkoxide and adding a carboxylic acid to the heated mixture for purposes of forming a metal alkoxycarboxylate. Of course, these solutions can also include an alkoxide portion, a carboxylate portion, and/or an alkoxycarboxylate portion. Preferred carboxylic acids include hexanoic acids and octanoic acids, and most preferably 2-ethylhexanoic acid. The carboxylic acid selected should have a carbon number ranging from about 4 to 10. The alcohol will typically have a carbon number of about 4 to 8. The most preferred alcohol is isopropyl alcohol.

The precursor ingredients are selected to provide a stoichiometric balance that will yield a desired solid metal oxide material upon thermal treatment of the precursor liquid. Zinc or another metal forming the foundation of a varistor crystal is preferably present as a majority of the total metals. Dopant elements, which are also bonded to organic ligands, are preferably added in concentrations up to 10% to 15% to enhance the nonohmic behavior of the zinc oxide. These dopant elements include bismuth, yttrium, praseodymium, cobalt, antimony, manganese, silicon, chromium, titanium, potassium, dysprosium, cesium, cerium, iron, and combinations thereof.

Figure 3:
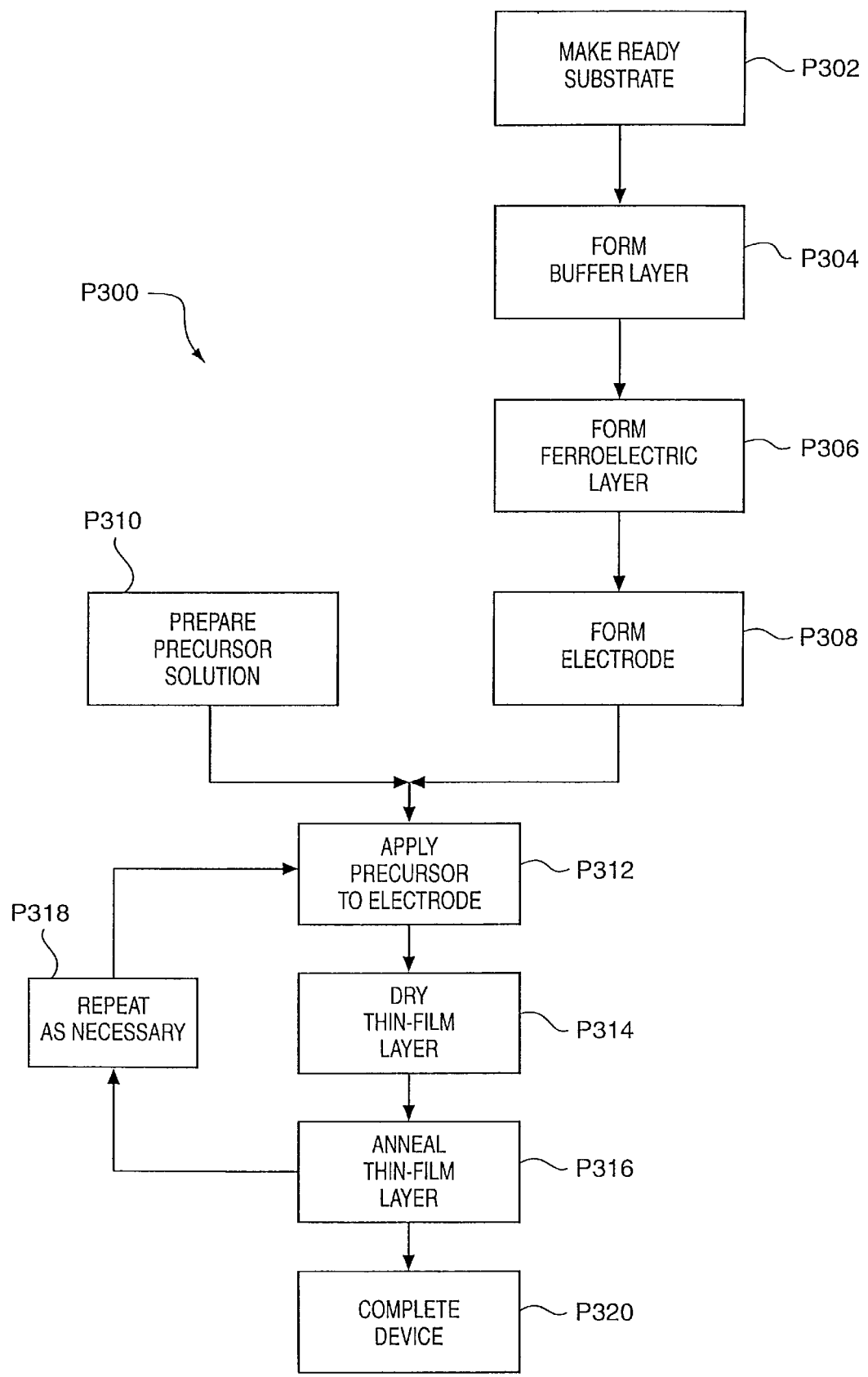
FIG. 3 depicts a schematic process diagram for use in making an FFET of the type depicted in FIG. 2.

FIG. 3 depicts a schematic process diagram of process P300 showing the steps of making the FFET 100 that is depicted in FIG. 2.

Step P302 is performed to make ready a substrate for application of successive layers. For example, a conventional silicon wafer or substrate 102 is thermally oxidized by conventional oven baking in oxygen to produce an oxide isolation layer, which is then etched by conventional techniques using a positive or negative photoresist to open a window over regions 106, 128 and 108. Tub 104 and source/drain regions 106 and 108 are essentially the same as any corresponding structure in a field effect transistor, and these features are formed by any conventional means, i.e., by implantation of p or n-dopants.

Step P304 is a highly preferred but optional step that includes the formation of buffer layer 130. Silicon nitride is preferably formed by low pressure chemical vapor deposition with the substrate heated to a temperature ranging from 700° C. to 1000° C. Alternatively, silicon nitride can be sputtered to a preferred thickness ranging from 10 nm to 20 nm, after which the substrate can be heated or annealed under nitrogen. The preferred anneal profile includes a duration ranging from two hours to thirty minutes at a maximum anneal temperature of about 600° C., including a five minute ramp up to the maximum temperature as well as a five minute ramp down. Yet another alternative is to sputter the buffer layer from a target of source material. After cooling of the substrate, step P304 may include the formation of an additional capping buffer layer (not depicted) comprising silicon dioxide or spin-on glass if it is later desired to orient ferroelectric layer 126 by exposure to radiation.

An oxidation phenomenon can occur in which the side of silicon nitride buffer layer 130 closest to ferroelectric layer 126 is oxidized during the oxygen anneal process in step 306 for the ferroelectric layer. The resultant formation of a thin silicon dioxide oxide layer (not depicted) is undesirable, but is sometimes unavoidable. A layer that is formed in this manner can act as a parasitic capacitor; however, the actual parasitic effect is negligible if the layer is thin enough. The effect of this thin film is of more consequence and is sometimes desirable when it is desired to orient ferroelectric layer 126 by exposure to radiation during the manufacturing process. Accordingly, when the growth of ferroelectric layer 126 will be oriented by radiation exposure, it is preferred to enhance the uniformity of buffer layer 130 by oxidizing the silicon nitride surface layer with a thirty minute anneal at 850° C. in an $O_2$ atmosphere at the conclusion of step P304.

Step P306 includes forming ferroelectric layer 126, which is preferably a layered superlattice material corresponding to one of the Smolenskii formulae. Ferroelectric layer 126 is initially deposited using a liquid precursor solution having a plurality of metal moieties in effective amounts for yielding a layered superlattice material upon thermal treatment of the solution. These solutions are preferably designed to yield respective perovskite-like metal oxide layers separated by bismuth oxide layers and having an average empirical formula according to Formula (2) above. These solutions are preferably formed of essentially anhydrous polyoxyalkylated metal complexes mixed with a compatible solvent. The precursors preferably include at least three metals. The polarization performance of ferroelectric layer 126 will in large part derive from the type of precursor solution selected, the purity of the reagents selected, and the subsequent processing of the solution. Metal 2-ethylhexanoates are particularly preferred for use in the solution, and these are mixed with xylenes or n-octane to a molarity ranging from 0.1 to 0.3 moles of the desired metal oxide product per liter of solution.

The liquid precursor solution is applied to the substrate including buffer layer 130. The application is preferably conducted by dropping the liquid precursor solution at ambient temperature and pressure onto the uppermost surface of the substrate, then spinning the substrate at from about 500 rpm to 3000 rpm for about 30 seconds to remove any excess solution and leave a thin-film liquid residue. The most preferred spin velocity is 1500 rpm. Alternatively, the liquid precursor may be applied by a misted deposition technique, such as the technique described in U.S. Pat. No. 5,456,945 issued on Oct. 10, 1995 to McMillan et al., which is hereby incorporated by reference herein to the same extent as though fully disclosed herein.

The resultant liquid precursor film is dried on a hot plate at a temperature of from about 150° C. to 500° C. in a dry air atmosphere. The drying time and temperature should be sufficient to remove or calcine substantially all of the organic materials from the liquid thin film and leave a dried metal oxide residue. The drying time preferably ranges from about one minute to about thirty minutes. For single-stage drying, a 400° C. drying temperature over a duration of about two to ten minutes in air is most preferred. It is more preferred, however, to dry the liquid film in stepped intervals. For example, the film can be dried for five minutes at 260° C. and for five minutes at 400° C. Additionally, it is preferred to conclude the drying cycle with a brief heating interval at a temperature exceeding 700° C., e.g., using a tungsten-nickel lamp to heat the substrate to 725° C. for thirty seconds.

Drying may also be performed simultaneously with exposing the precursor film to UV radiation. UV drying can produce a layered superlattice material having an enhanced C-axis orientation with improved electrical properties. This C-axis orientation can improve the dielectric constant and leakage current values that are obtained from the corresponding thin film of layered superlattice material. The deposition and drying cycles may be repeated until the desired thickness is attained for ferroelectric layer 126. A single layer provides a thickness of between 60 nm and 90 nm, while a thickness of about 180 nm to 200 nm typically requires two coats of a 0.130M to 0.200M precursor solution under the parameters disclosed herein.

The dried precursor residue is annealed to complete the formation of ferroelectric layer 126. This annealing step is referred to as the "first anneal" to distinguish it from other annealing steps; however, it should be understood that other anneal steps can occur prior to this "first anneal". The substrate including the dried precursor residue is heated in a diffusion furnace under an oxygen atmosphere to a temperature ranging from 400° C. to 1000° C. for a time ranging from thirty minutes to two hours. The first anneal is more preferably conducted at a temperature ranging from 600° C. to 800° C., with the most preferred anneal temperature being about 600° C. for eighty minutes. The first anneal step preferably occurs in a push/pull process including five minutes for the "push" into the furnace and five minutes for the "pull" out of the furnace. The indicated anneal times include the time that is used to create thermal ramps into and out of the furnace.

Step P308 includes forming second electrode 124 over ferroelectric layer 126. Second electrode 124 is sputter-deposited by conventional means, and this deposition provides a thickness ranging from 100 nm to 300 nm, with the most preferred thickness being about 200 nm.

Step P310 involves preparing a liquid precursor solution for use in depositing thin film layer 122. The precursors are preferably formed to include a zinc alkoxycarboxylate moiety, wherein the alkoxycarboxylate portion derives from zinc reacting with an alcohol having a carbon number ranging from 4 to 8 and a carboxylate having a carbon number ranging from 4 to 10. The precursor solutions contain a stoichiometrically balanced mixture of various polyoxyalkylated metals in proportions sufficient to yield the desired doped zinc oxide material. The molarity of the solutions is such that 0.1 to 0.4 moles of the desired metal oxide empirical formula may be obtained from a liter of the solution. Preferred carboxylic acids include hexanoic acids and octanoic acids, and most preferably 2-ethylhexanoic acid. The most preferred alcohol is isopropyl alcohol.

Zinc is preferably present as a majority of the total metals in the precursor. Dopant elements, which are also bonded to organic ligands, are preferably added to enhance nonlinear ohmic behavior and include bismuth, yttrium, praseodymium, cobalt, antimony, manganese, silicon, chromium, titanium, potassium, dysprosium, cesium, cerium, iron, and mixtures thereof. In the case of volatile metal dopants, such as bismuth, an approximate 5% to 10% excess molar portion of the volatile metal should be added to compensate for volatilization losses during the manufacturing process.

In step P312, the precursor is applied using a conventional spin-coating machine, such as those used to apply spin-on glass. The spin-coating process includes rotating the partially completed substrate with second electrode 124 exposed at the center of the wheel at an angular velocity speed ranging from about 1000 rpm to 2000 rpm. An eyedropper is used to deposit the precursor solution of Step P310 onto second electrode 124, with excess liquid being removed through the rotation. A resultant thin-film of liquid precursor solution coats electrode 124 and will be treated to yield thin film varistor layer 122. Alternatively, the liquid precursor may be applied in a misted deposition process mentioned above.

Step P314 includes drying the liquid film from step P312, preferably at a temperature ranging from 150° C. to 300° C. for a period of time ranging from about two minutes to about thirty minutes. This drying step serves to remove most of the precursor solvent, the organic ligands, and any organic contaminants from the liquid solution. A dried metal and metal oxide residue remains on the substrate. The drying step may be split into a sequence of at least two steps that include a first drying at a relatively lower temperature up to 300° C., and a second drying at a relatively higher temperature up to 500° C. For example, the first drying may occur for about thirty seconds in air by heating the substrate with a hot plate to a temperature that preferably ranges up to 300° C., then drying for an additional five minutes in air on a hot plate heated to 500° C. The two-stage drying option serves to enhance the purity of the metal oxide residue that remains on electrode 124 after drying.

Step P316 includes annealing the dried metal oxide residue of step P314, and is referred to as the second anneal. This annealing step preferably utilizes a rapid thermal processing technique in an oxygen environment; e.g., ultraviolet ("UV") radiation baking in air using a UV source such as a deuterium lamp, a tunable eximer laser, or a Danielson source. A conventional diffusion furnace may also be utilized.

The heat source is preferably used to ramp the temperature of the liquid precursor film at a rate up to 200° C. per second from room temperature up to a plateau temperature ranging from about 400° C. to about 1000° C. for a period of time, inclusive of the ramp time and the plateau holding time, ranging from about five seconds to about fifteen minutes. The maximum holding temperature is more preferably from about 500° C. to about 800° C. Heating to a temperature less than about 400° C. will typically fail to provide sufficient crystallization. Additionally, electrode wiring will begin to break down at temperatures exceeding about 800° C., and thermal diffusion can induce operational problems in the final varistor product. After heating, the substrate is preferably cooled to room temperature by decreasing environmental temperature at a rate having a magnitude exactly opposite the ramped rate of temperature increase.

These annealing process parameters, including the ramp up to a maximum temperature, the selection of a maximum temperature, the duration of holding a maximum temperature, and the rate of cooling, may be selectively adjusted for purposes of controlling the size of the crystals that are formed. The plateau temperature is preferably held for a period of time ranging from about fifteen seconds to ten minutes. Thereafter, the substrate is preferably cooled by ramping environmental temperature down to room temperature.

By way of specific example, a maximum temperature of 550° C. for 60 seconds typically produces varistor crystal grains of approximately 20 nm to 30 nm in average diameter. Raising the temperature will provide increasingly smaller crystal grains, with grains of approximately 10 nm being produced by a maximum temperature of about 650° C.

The high annealing temperature of step P316 typically removes the solvent and any organic functional group residue that remains in the film after drying; however, a very small amount of organic material will be calcined in situ and introduce carbon as a minor contaminant to the film. The existence of this carbon contamination is not extremely significant, in that it does not prevent the material from functioning as a varistor; however, the presence of carbon residue may slightly alter electrical properties in materials produced according to the invention.

In step P318, the substrate is again subjected to the spin-on deposition of a liquid zinc oxide layer, and process steps P312 through P316 are repeated as required to increase the thickness of thin film varistor layer 122. The desired thickness preferably ranges from about 50 nm to about 500 nm.

Step P320 includes completing the device, preferably by sputtering first electrode 120 atop thin film varistor layer 122, annealing the device, and patterning the device by a conventional photoetching process including the application of a positive resist material followed by ion-etching. After patterning, the entire device may be annealed once more to relieve stress fracturing caused by the etching process.

This process forms a wafer having a plurality of FFET cells on a single wafer. Each circuit preferably includes a zinc oxide thin film varistor layer 122 having a film thickness less than 200 nm, and in which the size of the zinc crystal grains is less than 50 nm. In more preferred devices, the thickness is preferably less than about 1000 nm and grain sizes preferably range from about 50 nm to about 500 nm in combination with crystal grain sizes from about 10 nm to about 300 nm. In integrated circuits utilizing thin films, the layer 122 thickness preferably ranges from 40 nm to 500 nm with crystal grain sizes from about 10 nm to 200 nm.

The following non-limiting examples set forth preferred materials and methods for practicing the present invention.

EXAMPLE 1

PREPARATION OF A ZINC OXIDE PRECURSOR SOLUTION WITH BISMUTH DOPANT

A liquid zinc oxide precursor solution was prepared by mixing zinc 2-ethylhexanoate into a 50/50 (v/v) solvent mixture of xylene and butyl acetate to provide a zinc 2-ethylhexanoate concentration of about 0.1 mol/L. Bismuth 2-ethylhexanoate was added to this mixture under a desiccated atmosphere having less than about 40% humidity in a quantity sufficient to produce bismuth concentrations of 0, 0.5, 1, and 5 mole percent bismuth 2-ethylhexanoate. These bismuth concentrations were determined as the number of moles of bismuth 2-ethylhexanoate divided by the number of moles of bismuth 2-ethylhexanoate plus the number of moles of zinc 2-ethylhexanoate, i.e, bismuth as a percentage of total metals.

FIG. 4 depicts the absolute value of the leakage current obtained from thin film varistors that were made using this solution according to steps P308–P320. FIG. 4 shows that thin film zinc oxide varistor layers having 5% bismuth have a relatively low leakage current together with a correspondingly high voltage drop with increasingly high rates of nonohmic behavior. If we make a rough assumption that the leakage current is proportional to the resistivity, we see that this material provides a little more than two orders of magnitude difference between the resistivity at 5 V and the resistivity at 1 V. Thus, this material can provide between a thousand-fold and ten-thousand-fold improvement in reliability in a memory for which the read and write voltages are 5 V and disturb voltages are 1 V or lower, which is consistent with practical current memory technology. Thus, we see that the protective device and method of the invention will provide significant improvement in reliability with current technology. As our ability to provide thin film varistors with larger differences between the high voltage resistivity and the low voltage resistivity improves, the improvements in reliability will also increase.

While the invention has been described in terms of an FFET having two electrodes, it can also be applied to FFETS having other numbers of electrodes, such as a varistor on top of an MFMIS device, which would result in three electrodes. Further, it can also be applied to other FERAMS and other ferroelectric devices.

Those skilled in the art will recognize that the discussions above with respect to the relationships between the resistivity of the protective device 110 and the capacitance of the ferroelectric capacitor 111 and the values derived for the resistivities and capacitances, which were made based on an embodiment in which the protective device was a varistor, could have just as well have been made for an embodiment in which the protective device was a diode or a Schottky diode 107 connected to the gate of the ferroelectric FET 109 as shown in FIG. 7A, as well as for other equivalent electronic devices, with only minor changes in the discussion, since the equivalent circuit of FIG. 8 can be applied to those devices also. Thus, it should be understood that the protective device 110 can take many other forms, including a diode, a Schottky diode or other equivalent devices.

Those skilled in the art will understand that the preferred embodiments described above may be subjected to other modifications without departing from the scope and spirit of the invention. The inventors, accordingly, hereby state their intention to rely upon the Doctrine of Equivalents, to protect their full rights in the invention.

What is claimed is:

1. An integrated circuit memory comprising:
    a ferroelectric field effect transistor including a ferroelectric element;
    a conductor for applying a voltage to said ferroelectric element; and
    a disturb protect device between said conductor and said ferroelectric element in said field effect transistor.

2. An integrated circuit memory as in claim 1 wherein said disturb protect device comprises an electrical element selected from the group consisting of: a thin film varistor, a diode, and a Schottky diode.

3. An integrated circuit memory as in claim 1 wherein said disturb protect device comprises a thin film varistor.

4. An integrated circuit memory as in claim 1 wherein said disturb protect device has a capacitance less than one one-hundredth of a capacitance of said ferroelectric field effect transistor at operable frequencies in the intended environment of use.

5. An integrated circuit memory as in claim 1 wherein, for voltages at which disturb voltages are likely to occur, said disturb protect device has a resistance obeying a formula $$R_d > 100 \times 1/(2\pi f C_F),$$

wherein $R_d$ is resistivity of said disturb protect device, f is an operating frequency of said memory, and $C_F$ is capacitance of said ferroelectric element.

6. An integrated circuit memory as in claim 1 wherein, for voltages at which disturb voltages are likely to occur, said disturb protect device has a resistance obeying a formula $$R_d > 10 \times 1/(2\pi f C_F),$$

wherein $R_d$ is resistivity of said disturb protect device, f is an operating frequency of said memory, and $C_F$ is capacitance of said ferroelectric element.

7. An integrated circuit memory as in claim 1 wherein, for voltages at or near the read and write voltage of said memory, said disturb protect device has a resistance obeying a formula $$R_d < 0.01 \times 1/(2\pi f C_F),$$

wherein $R_d$ is resistivity of said disturb protect device, f is an operating frequency of said memory, and $C_F$ is capacitance of said ferroelectric element.

8. An integrated circuit memory as in claim 1 wherein, for voltages at or near the read and write voltage of said memory, said disturb protect device has a resistance obeying a formula $$R_d < 0.1 \times 1/(2\pi f C_F),$$

wherein $R_d$ is resistivity of said disturb protect device, f is an operating frequency of said memory, and $C_F$ is capacitance of said ferroelectric element.

9. An integrated circuit memory as in claim 1 wherein, for voltages at or near the read and write voltage of said memory, said disturb protect device has a resistance of less than 100 kiloohms and a capacitance of greater than 0.01 microfarads.

10. An integrated circuit memory as in claim 1 wherein, for voltages at which disturb voltages are likely to occur, said disturb protect device has a resistance of more than 1,600 megaohms and a capacitance of less than 1.0 picofarads.

11. An integrated circuit memory as in claim 1 wherein, for voltages at or near the read and write voltage of said memory, said disturb protect device has a resistance of less than 1000 kiloohms and a capacitance of greater than 0.001 microfarads.

12. An integrated circuit memory as in claim 1 wherein, for voltages at which disturb voltages are likely to occur, said disturb protect device has a resistance of more than 160 megaohms and a capacitance of less than 10.0 picofarads.

13. An integrated circuit memory as in claim 1 wherein said disturb protect device comprises zinc oxide.

14. An integrated circuit memory as in claim 13 wherein said zinc oxide is doped with an element selected from the group consisting of bismuth, yttrium, praseodymium, cobalt, antimony, manganese, silicon, chromium, titanium, potassium, dysprosium, cesium, cerium, iron, and mixtures thereof.

15. An integrated circuit memory as in claim 1 wherein said ferroelectric element includes a layered superlattice material.

16. An integrated circuit memory as in claim 1 wherein said disturb protect device has a capacitance less than one one-hundredth of the capacitance of said ferroelectric device at voltages at which disturb voltages are likely to occur.

17. An integrated circuit memory as in claim 1 wherein said ferroelectric field effect transistor further comprises:
   a substrate;
   a source region formed within said substrate;
   a drain region formed within said substrate;
   a channel region between said source region and said drain region; and
   said ferroelectric element comprises a ferroelectric gate located directly above said channel region.

18. An integrated circuit memory in claim 17 wherein said conductor comprises a first electrode and further including a second electrode between said disturb protect device and said ferroelectric gate.

19. A method of operating an integrated circuit memory comprising a thin film varistor and a thin film ferroelectric field effect transistor capable of switching between a first polarization state and a second polarization state, said method comprising the steps of:
   delivering a first voltage pulse to said thin film varistor essentially without disturbing the polarization state of said ferroelectric field effect transistor, said first voltage pulse being of a voltage sufficient to disturb said polarization state if applied directly to said ferroelectric field effect transistor; and
   delivering a second voltage pulse of a higher voltage than said first voltage pulse to said thin film varistor to switch said polarization state of said ferroelectric field effect transistor.

20. A method as in claim 19 wherein said step of delivering a first voltage pulse without disturbing the polarization state of the ferroelectric device comprises screening said ferroelectric field effect transistor from said first voltage pulse.

* * * * *